United States Patent
McFadden et al.

(10) Patent No.: US 7,622,244 B2
(45) Date of Patent: Nov. 24, 2009

(54) METHOD FOR CONTAMINANT REMOVAL

(75) Inventors: Erika Lee McFadden, Dallas, TX (US); Ronald Charles Roth, McKinney, TX (US); Lisa Ann Wesneski, The Colony, TX (US)

(73) Assignee: Texas Instruments Incorporated, Dallas, TX (US)

( * ) Notice: Subject to any disclaimer, the term of this patent is extended or adjusted under 35 U.S.C. 154(b) by 631 days.

(21) Appl. No.: 11/407,634

(22) Filed: Apr. 20, 2006

(65) Prior Publication Data
US 2007/0248914 A1 Oct. 25, 2007

(51) Int. Cl.
*H01L 21/00* (2006.01)
*G03F 1/00* (2006.01)

(52) U.S. Cl. .................. 430/320; 430/311; 430/321; 430/330; 216/24; 134/1.3

(58) Field of Classification Search .................. 430/320, 430/330, 321.311; 216/24; 359/439; 134/1.3
See application file for complete search history.

(56) References Cited

U.S. PATENT DOCUMENTS

| 5,567,334 | A  | * | 10/1996 | Baker et al. ................. 216/24 |
| 6,383,723 | B1 | * | 5/2002  | Iyer et al. .................. 430/327 |
| 2002/0144707 | A1 | * | 10/2002 | Chiu ........................ 134/1.3 |
| 2005/0233921 | A1 | * | 10/2005 | Lee et al. .................. 510/175 |

* cited by examiner

*Primary Examiner*—Thorl Chea
(74) *Attorney, Agent, or Firm*—Wade James Brady, III; Frederick J. Telecky, Jr.

(57) ABSTRACT

Method for removing contaminants from a surface during semiconductor fabrication. A preferred embodiment comprises developing a resist layer on a top surface of a semiconductor substrate, curing the developed resist layer, and cleaning the developed resist layer with a developer solution to remove contaminants. The cleaning makes use of the same developer solution used to develop the resist layer, so the cleaning makes use of a process that already exists and requires no additional investment to implement, while the curing stabilizes the developed resist layer so that the cleaning does not damage the developed resist layer.

12 Claims, 3 Drawing Sheets

METHOD FOR CONTAMINANT REMOVAL

TECHNICAL FIELD

The present invention relates generally to a method for semiconductor fabrication, and more particularly to a method for removing contaminants from a surface during semiconductor fabrication.

BACKGROUND

The fabrication of semiconductor devices typically requires a clean environment since the presence of contaminants can reduce the yield of the fabrication process. The contaminants can prevent the proper formation of various structures and components making up a semiconductor device. For example, contaminants can prevent the creation of electrical conductors, insulators, contacts, vias, pads, and so forth, as intended. The improper formation of the various structures and components of a semiconductor device can result in the semiconductor device not being able to operate as designed or at all.

The contaminants can arise from a fabricating environment that is not sufficiently clean. In such a situation, contaminants such as dust particles in the air, dissolved and undissolved materials in fluids and solutions, defects in the materials, and so forth, can be introduced into the fabrication process. Contaminants can also arise as a result of the fabrication process itself. For example, the development of resist layers, the etching of high-K materials, and so on, can leave residual materials that if not removed, can contaminate the semiconductor wafer.

With reference now to FIGS. 1a and 1b, there are shown diagrams illustrating contaminants on a semiconductor substrate and a potential effect of contaminants on semiconductor device fabrication. The diagram shown in FIG. 1a illustrates a semiconductor substrate 100 with contaminants, such as a single contaminant 105 and a group of contaminants 106. An entirety of contaminants 107, including the single contaminant 105 and the group of contaminants 106 and others not specifically labeled, shown in FIG. 1a can be referred to as being a satellite defect.

The semiconductor substrate 100, as shown in FIG. 1a, is used in the manufacture of arrays of micromirror light modulators, also referred to as digital micromirror devices (DMD), to be used in microdisplay-based display systems. The diagram illustrates the semiconductor substrate 100 after the developing of a resist layer 110 intended to create an underlying support structure for a subsequent layer, such as a mirror of the micromirror light modulator, a hinge for the mirror, or any other type of layer. Developing a resist layer can include the exposure of the resist layer to a light (or some form of radiation) that has passed through a pattern mask, with portions of the resist layer exposed to the light (or radiation) being physically changed and then rinsing away parts of the resist layer with a developing solution. The developing of the resist layer 110 resulted in the formation of contaminants, such as the contaminant 105 and the group of contaminants 106, on the surface of the resist layer 110.

The contaminants resulting from the developing of the resist layer 110, if not removed, can be covered by subsequently-formed layers. For example, the contaminants 105 and 106 shown on the resist layer 110 can be covered by a layer of mirror material when the mirror material is deposited onto the resist layer 110. The diagram shown in FIG. 1b illustrates a layer of mirror material 150 after being deposited onto the resist layer 110, wherein the resist layer 110 has contaminants 105 on its surface. The layer of mirror material 150 will coat the contaminants 105 and will produce bumps, such as bump 155, as a result of the contaminants 105. Although shown in the context of the mirror of the micromirror light modulator, contaminants can produce bumps in other layers, wherein there is a layer of material deposited over a patterned resist layer.

The bumps 155 can negatively affect the reflectivity of the mirror formed on the resist layer 110. For example, the bumps 155 on the mirror surface can scatter light rather than accurately reflecting the light. The bumps 155 may also alter the tilt angle of the mirror if the bumps 155 are located in a position where the pivoting mirror makes contact. Furthermore, if the bumps 155 are in a hinge layer, the bumps 155 may cause a locally high electromagnetic field that can cause residue to form and cause mirror failure over time. In a display system, an important measure of the image quality is the display system's contrast ratio, which is a ratio of a brightest gray shade (typically pure white) displayable to a darkest gray shade (usually pure black) displayable. However, light scattered on the surface of the mirror due to the bumps 155 can brighten the darkest gray shade, thereby reducing the contrast ratio of the display system. Furthermore, since some of the light striking the mirror is scattered, the display system is also not capable of maximizing its brightest gray shade. Additionally, individual light modulators with mirrors with different tilt angles can cause poor image and contrast ratio uniformity across the array of micromirror light modulators.

Contaminants present in the fabricating environment can be addressed through the employment of better filtration systems to filter the air in the fabricating environment, for example. Additionally, the use of higher grade materials in the fabrication process can further reduce the number of contaminants in the fabricating environment. To eliminate contaminants arising from the fabrication process, it is possible to clean the semiconductor wafer with a cleaning fluid or solvent to remove at least some of the contaminants.

One disadvantage of the prior art is that a cleaning fluid that is capable of removing a contaminant arising from a fabrication process may be damaging to structures and/or layers of materials on the semiconductor substrate. Damage to the structures and layers already present on the semiconductor substrate can potentially be more harmful to the operation of the semiconductor devices than the negative effects of the contaminants.

Another disadvantage of the prior art is that the use of a cleaning fluid that does not damage structures and materials already present on the semiconductor substrate may not be able to remove a sufficient number of contaminants to make the cleaning process worthwhile.

SUMMARY OF THE INVENTION

These and other problems are generally solved or circumvented, and technical advantages are generally achieved, by preferred embodiments of the present invention which provides a method for removing contaminants from a surface during semiconductor fabrication.

In accordance with a preferred embodiment of the present invention, a method for cleaning contaminants from a semiconductor substrate is provided. The method includes developing a resist layer on a top surface of the semiconductor substrate and curing the developed resist layer. The method also includes cleaning the developed resist layer with a developer solution to remove contaminants.

In accordance with another preferred embodiment of the present invention, a method for fabricating an array of light modulators on a substrate is provided. The method includes forming electrical addressing circuitry on the substrate and forming hinges over the electrical addressing circuitry. The method also includes forming mirrors on each hinge and depositing a mirror material over the cured developed resist layer. The mirror forming includes developing a resist layer over the hinges, curing the developed resist layer, and cleaning the cured developed resist layer with a developer solution to remove contaminants.

In accordance with another preferred embodiment of the present invention, a method for forming a display system is provided. The method includes optically coupling an array of light modulators to a light source and coupling a controller to the array of light modulators. The array of light modulators creates images by setting each light modulator in the array to a state needed to properly display an image on a display plane by reflecting a light from the light source and the controller issues commands to control the operation of the array of light modulators. The array of light modulators is manufactured by forming electrical addressing circuitry on the substrate and forming hinges over the electrical addressing circuitry. The manufacture of the array of light modulators also includes forming mirrors on each hinge and depositing a mirror material over the cured developed resist layer. The mirror forming includes developing a resist layer over the hinges, curing the developed resist layer, and cleaning the cured developed resist layer with a developer solution to remove contaminants.

An advantage of a preferred embodiment of the present invention is that it can be fully effective in removing contaminants arising from developing a resist layer. The present invention achieves the cleaning effectiveness without causing any damage to structures, materials, and so forth, already present on the semiconductor substrate. The present invention can also be effective in removing at least some contaminants and residues not arising from the developing of the resist layer.

A further advantage of a preferred embodiment of the present invention is that it is modular, meaning that the cleaning can occur at any resist pattern level in the semiconductor substrate. The present invention can therefore be used to clean the semiconductor substrate and keep the semiconductor substrate clean throughout the fabrication of the semiconductor device.

Yet another advantage of a preferred embodiment of the present invention is that it is a single step process that is already implemented in a typical semiconductor fabrication process and therefore requires no changes to existing process steps. The present invention can be implemented at very little additional cost.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the elimination of contaminants arising during the fabrication of a mirror of a micromirror light modulator for use in display systems. The invention may also be applied, however, to other forms of light modulators, such as a deformable light modulator, wherein a mirror surface deforms to change the direction of a reflected light beam. Additionally, the present invention can be applied to other layers in the micromirror light modulator, such as the hinge layer and the electrical addressing circuitry layer. The invention may also be applied to applications where there is a desire to eliminate contaminants present in the fabrication of semiconductor devices and integrated circuits, such as circuits with moving mechanical parts (for example, micro electromechanical systems (MEMS)) wherein the contaminants can hinder the operation of the mechanical parts, or circuits and devices wherein there is a desire to maximize the performance by minimizing contaminants that could negatively affect performance by altering geometries, critical dimensions, electrical characteristics, and so forth.

The light modulator in a micromirror light modulator is a mirror that is mounted on a hinge and pivots along an axis of reflection about the hinge. The mirror can either reflect light onto a display plane or away from the display plane, depending upon image data that it is displaying. A DMD contains a plurality of micromirror light modulators arranged in an array configuration and operating in synchrony, with each micromirror light modulator displaying image data corresponding to its portion of an image. The combination of the light reflected by all the micromirror light modulators creates the image on the display plane. The quality of the mirrors in the DMD can therefore play an important role in the quality of the images being displayed.

Figure 2A:
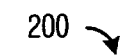
FIGS. 2a through 2f are diagrams of exemplary cross-sectional views of a portion of a micromirror light modulator, according to a preferred embodiment of the present invention.
Figure 2A:
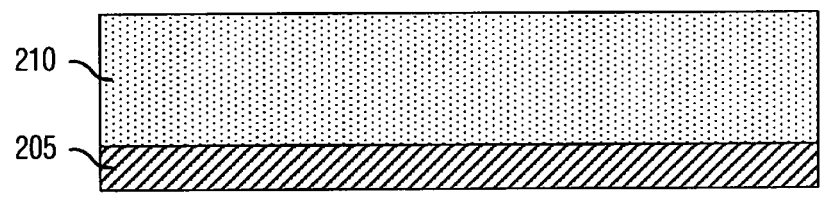

With reference now to FIGS. 2a through 2e, there are shown diagrams illustrating exemplary cross-sectional views of a portion of a micromirror light modulator 200 during the fabrication of the micromirror light modulator 200, according to a preferred embodiment of the present invention. The diagram shown in FIG. 2a illustrates a portion of a hinge 205 with a resist layer 210 applied over the hinge 205. In practice, the resist layer 210 would be applied over the entirety of a semiconductor wafer that contains the micromirror light modulator 200 being displayed in FIG. 2a. The resist layer 210 will be used in the creation of a support layer that will enable the fabrication of a mirror for the micromirror light modulator 200.

The micromirror light modulator 200 may have undergone fabrication processes prior to reaching a condition as shown in FIG. 2a. The fabrication processes may include the formation of electrical conductors, hinge support structures, hinges, and so forth. The diagrams shown in FIGS. 2a through 2f are not intended to illustrate the various structures of the micromirror light modulator 200 accurately or to proper scale. The intent of the diagrams is to show a positional relationship between the structures of the micromirror light modulator 200, as well as the sequence of operations involved in the fabrication of the micromirror light modulator 200. The diagrams should therefore not be considered as being limiting to either the scope or the spirit of the present invention.

Figure 2B:
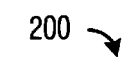
Figure 2B:
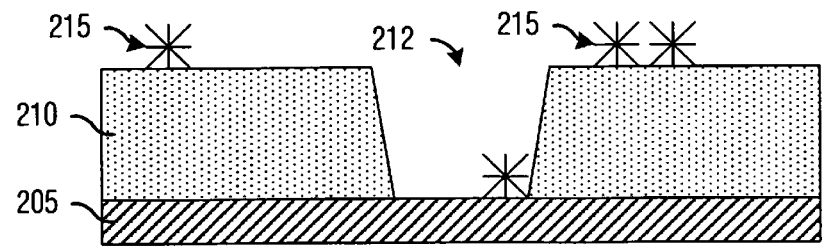

The diagram shown in FIG. 2b illustrates the micromirror light modulator 200 after the resist layer 210 has been patterned and developed. The patterning of the resist layer 210 can include the illumination of the resist layer 210 with light that has been passed through a mask (not shown). The mask contains a pattern that is to be reproduced onto the resist layer 210. For example, the mask may contain a negative image of the pattern to be reproduced on the resist layer 210, then, when illuminated by the light, for example, the portions of the resist layer 210 so exposed will harden and will become impervious to a developing solution while the portions of the resist layer 210 not exposed to the light will be washed away by the solution. Similarly, in a complementary technique, the mask can contain a positive image of the pattern and the portions of the resist layer illuminated by the light can be washed away by the developing solution.

The diagram shown in FIG. 2b illustrates the micromirror light modulator 200 after a first developing of the resist layer 210, with the mask forming a via 212 in the resist layer 210. The first developing of the resist layer 210 by the developing solution may leave contaminants, such as contaminant 215, on the surface of the remaining parts of the resist layer 210. The contaminant 215 may also drop down into the via 212 as well as other openings in other parts of the micromirror light modulator 200, but not shown in FIG. 2b.

Figure 1A:
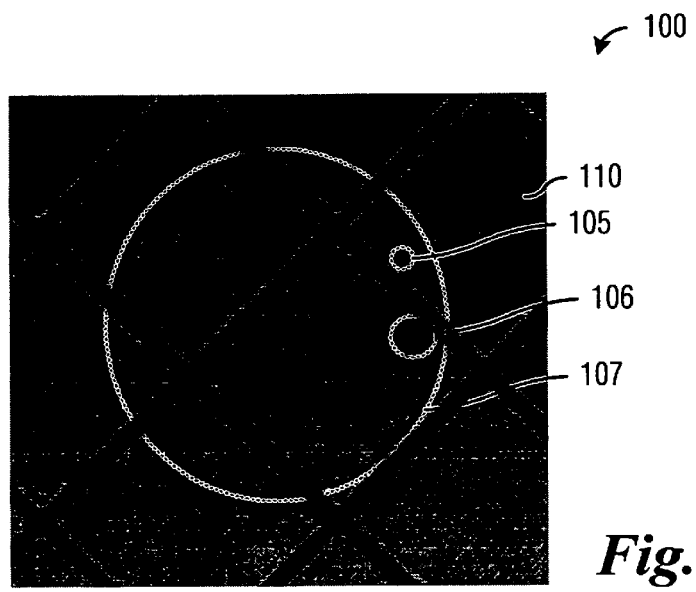
FIGS. 1a and 1b are diagrams of contaminants on a semiconductor substrate and a potential effect of contaminants on semiconductor device fabrication.
Figure 1B:
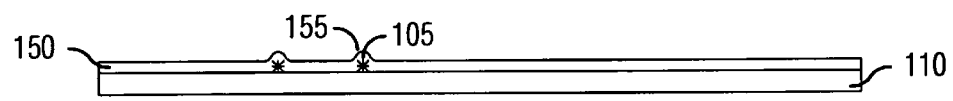

The contaminant 215, if not removed, can present problems in subsequent fabrication processes. For example, if an additional layer is deposited on top of the contaminant 215, the contaminant 215 can cause bumps to form in the additional layer (as shown in FIG. 1b). The contaminant 215, if not removed, can also deform structures (such as an underside of a mirror in a micromirror light modulator) and can cause the structure to fail, not operate properly (due to contaminant 215 impeding the movement of the structure), or damage to other parts of the micromirror light modulator 200 (when the contaminant 215 strikes the other parts of the micromirror light modulator 200 when moved by the moving structure).

Figure 2C:
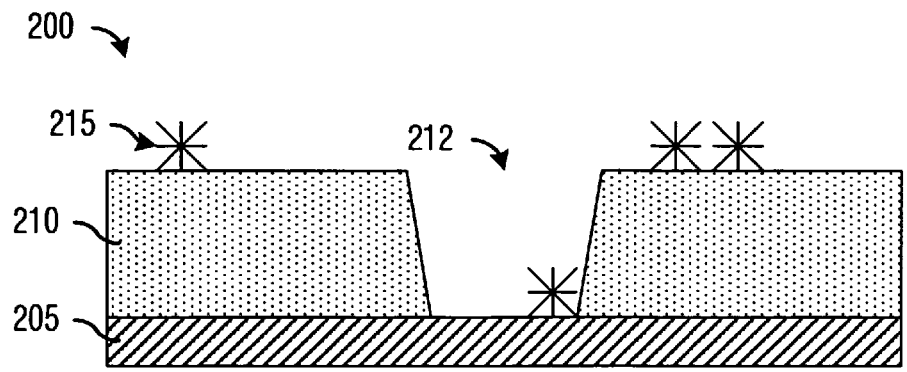

The diagram shown in FIG. 2c illustrates the micromirror light modulator 200 after having undergone an ultraviolet light (UV) cure. The UV cure hardens the resist layer 210 and makes it more resistant to solvents used in subsequent fabrication processes by cross-linking the polymers of the resist material. Depending on factors such as resist material type and thickness, the parameters of the UV cure can vary significantly. An exemplary UV cure can make use of UV light in the wavelength range of 270 to 330 nm (nanometers), with the resist layer 210 being exposed to the UV light for a time of about 90 seconds with a cure temperature of about 180° C. The UV cure has no notable effect on the contaminants 215.

Figure 2D:
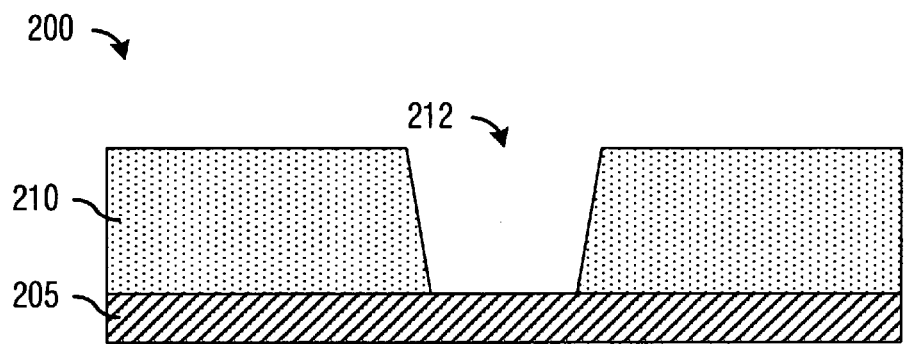

The diagram shown in FIG. 2d illustrates the micromirror light modulator 200 after having undergone a second resist develop. According to a preferred embodiment of the present invention, the second resist develop is performed utilizing the same developing solution and with similar develop conditions as the first resist develop (as shown in FIG. 2b). The second resist develop comprises rinsing the micromirror light modulator 200 with the same developer solution used in the first resist develop. Since the UV cure hardened the resist layer 210 by causing polymers in the resist material to cross-link, the resist layer 210 is made non-reactive (or less reactive) to the resist develop. Therefore, the second resist develop causes substantially no change to the resist layer 210, and the pattern of the mask created in the resist layer 210 remains. However, the second resist develop can be effective at removing the contaminant 215 that resulted from the first resist develop. In addition to removing the contaminant 215 from the first resist develop, the second resist develop can also remove surface particles and contaminants that may also be present on the semiconductor substrate, such as contaminants arising from other fabrication processes as well as from the fabrication environment.

Figure 2E:
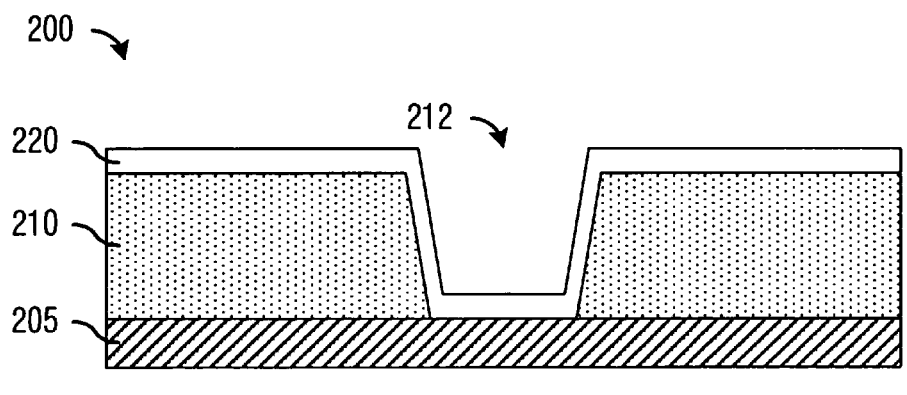

The diagram shown in FIG. 2e illustrates the micromirror light modulator 200 after the formation of a mirror 220. The mirror 220 can be created by depositing a material, such as aluminum, titanium, silicon, and so forth, on the resist layer 210. Created using deposition, the mirror 220 is able to follow the contour of the resist layer 210, for example, partially filling the via 212 and coating the wall of the via 212 to create a connection with the hinge 205. Without contaminants on the surface of the resist layer 210, the mirror 220 can be as smooth as the deposition process will allow, maximizing the reflectivity of the mirror 220. If contaminants were present on the surface of the resist layer 210, the deposition of the material to form the mirror 220 could create bumps over the contaminants (such as shown in FIG. 1b), thereby reducing the reflectivity of the mirror 220 and potential changes to the tilt angle due to deformation of the hinge or the mirror 220.

Figure 2F:
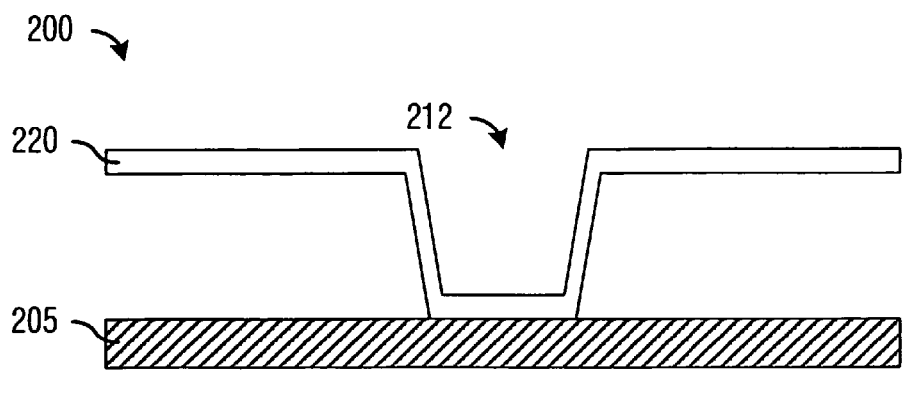

The diagram shown in FIG. 2f illustrates the micromirror light modulator 200 after the resist layer 210 has been etched away to free the mirror 220 to pivot on the hinge 205. To remove the resist layer 210 that is under the mirror 220, an isotropic etch is performed, which will remove the resist layer 210 covered by the mirror 220. With the resist layer 210 removed, the fabrication of the micromirror light modulator 200 can proceed to completion. Additional fabrication processes can include filling the via 212 to reduce the amount of light scattered by the via 212, testing, singulating, and packaging the arrays of micromirror light modulators.

Contaminants may also pose problems for other layers in the micromirror light modulator. For example, contaminants formed in the developing of a resist layer used to create hinges can create a locally high electric field effect. Over time, this can cause residue to precipitate at the contaminant location and cause the mirror to fail or they may prevent the mirror from reaching its full tilt angle, which could negatively affect the images and the contrast ratio of the display system making use of the micromirror light modulator. Also, contaminants formed in the developing of a resist layer used to create electrical addressing circuitry can prevent the proper formation of the electrical addressing circuitry.

Figure 3:
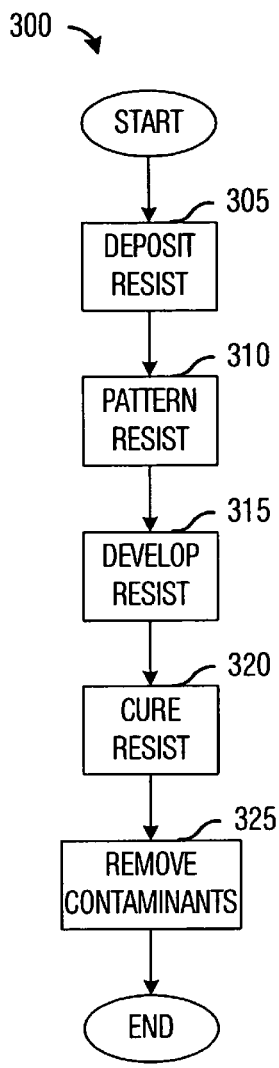
FIG. 3 is a diagram of a sequence of events in the removal of contaminants, according to a preferred embodiment of the present invention.

With reference now to FIG. 3, there is shown a diagram illustrating a sequence of events 300 in the removal of contaminants arising from the developing of a resist layer, according to a preferred embodiment of the present invention. As discussed previously, the developing of a resist layer can leave a significant number of contaminants on the surface of the developed resist layer. In some applications, the contaminants may not be a significant problem, however, in certain applications such as MEMS or semiconductor devices with very small feature sizes, the contaminants may pose a major problem to the proper operation of the systems and devices. The sequence of events 300 describes a portion of a fabrication process of a semiconductor device, providing a detailed view of events in the formation, patterning, and cleaning of a resist layer.

The sequence of events 300 begins with the depositing of a resist layer (block 305). The resist layer can be deposited using a spin coat deposition technique, wherein a resist material in a liquid form, such as an I-line resist or a deep UV resist, can be dispensed onto a semiconductor wafer and then the semiconductor wafer can be spun to spread the resist material in a uniformly thin layer over the surface of the semiconductor wafer. Solvents making the resist material liquid can then be subjected to a soft bake, such as by a hot plate, to drive off (by evaporation) a large percentage of the solvents. Then the resist layer can be patterned with a light or some form of radiation passed through a pattern (block 310). The light (or radiation) can change the chemical properties of portions of the resist layer that the light (or radiation) strikes, making the portion susceptible (or insusceptible) to a solution that is used to develop the resist layer (block 315). Tetramethyl ammonium hydroxide ($N(CH_3)_4OH$) in solution form can be used as a developer solution for a resist layer made from I-line resist or a deep ultraviolet resist, for example.

The developing of the resist layer transfers the pattern on the mask (either a negative or a positive transfer of the mask) onto the resist layer (block 315). However, in addition to removing portions of the resist layer, the developing of the resist layer can leave some contaminants on the surface of the resist layer as well as other parts of the semiconductor substrate. The contaminants should be removed to maximize the yield of the semiconductor device being fabricated on the semiconductor substrate.

According to a preferred embodiment of the present invention, the removal of the contaminants should be achieved utilizing standard processes so that the complexity of the manufacture of the semiconductor device does not greatly increase, which will help to minimize the manufacture costs of the semiconductor device. The contaminants can be removed by repeating the develop process, however, repeating the develop process will distort, e.g., the critical dimensions or profile, the resist layer if the chemical properties of the resist layer are not modified. The resist layer's chemical properties can be changed by curing the resist layer (block 320).

According to a preferred embodiment of the present invention, the resist layer can be cured by a UV cure, which exposes the resist layer to a UV light for a specified amount of time. A preferred UV cure comprises exposing the resist layer to a UV light with a wavelength range of 270 to 330 nm for a period of about 90 seconds and a temperature of about 180° C. The exposure to the UV light results in a cross-linking of the surface of the resist material, and the use of a hot plate in conjunction with the heat produced by the UV light helps to cure the bulk of the resist layer. Other curing processes that stabilize the resist layer can be used in place of the UV light. After curing (block 320), the develop process can be repeated to remove the contaminants (block 325). With the contaminants removed, the manufacture of the semiconductor device can continue.

Figure 4A:
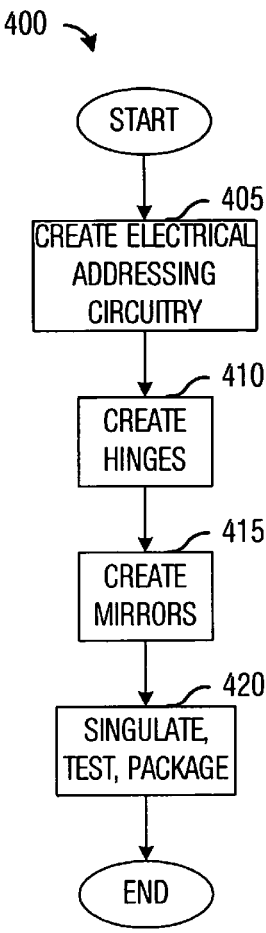
FIGS. 4a and 4b are diagrams of sequences of events in the manufacture of an array of micromirror light modulators, according to a preferred embodiment of the present invention.
Figure 4B:
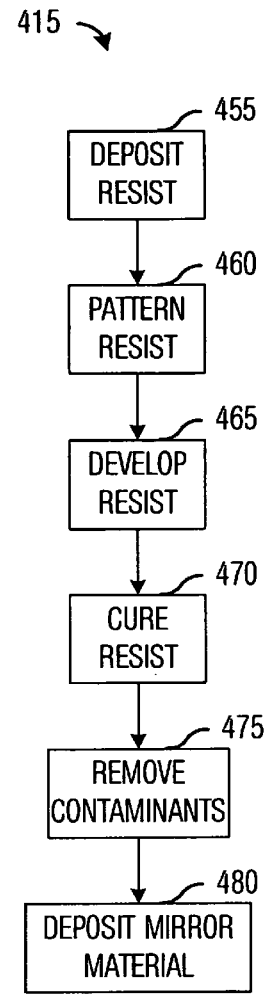

With reference now to FIGS. 4a and 4b, there are shown diagrams illustrating sequences of events in the manufacture of an array of micromirror light modulators, according to a preferred embodiment of the present invention. An array of micromirror light modulators contains a plurality of individual micromirror light modulators normally arranged in a grid. Each micromirror light modulator includes a mirror that pivots along an axis of reflection on a hinge to reflect light from a light source either onto or away from a display plane. Since the amount of light reflected by the mirror of a micromirror light modulator is a function of the reflectivity of the mirror, it is desirable that the mirror be as smooth as possible to maximize the reflectivity by minimizing light scatter. Therefore, there is a need to eliminate as much of the contaminants as possible prior to the creation of the mirror.

A sequence of events 400 shown in FIG. 4a illustrates events in the manufacture of an array of micromirror light modulators. Starting with a semiconductor substrate, the manufacture of the array of micromirror light modulators can begin with the creation of electrical addressing circuitry (block 405). The electrical addressing circuitry can include signal conductors, memory storage, and so on. The electrical addressing circuitry can be used to allow the individual addressing of each micromirror light modulator in the array, storing image data for each micromirror light modulator, initiating mirror state changes, and so forth. The electrical addressing circuitry can be created through one or more iterations of typical semiconductor device fabrication processes, including resist layer deposition, resist layer patterning, resist layer developing, etching, implanting, material deposition, and so forth. After the electrical addressing circuitry has been created, a hinge for each micromirror light modulator in the array of micromirror light modulators can be created (block 410). The hinge can include a mechanical pivot for the mirror of micromirror light modulator as well as hinge support structures for the hinge.

Once the hinges have been created (block 410), the mirrors can be created (block 415). The mirrors can be created by depositing a mirror material, such as aluminum, titanium, silicon, and so forth, onto an underlying support layer that is formed over the hinge. With the mirror so formed, the underlying support layer can be etched away to free the mirror. A detailed discussion of one technique used to create the mirror is provided below. After the mirrors are created and the underlying support layer etched away, the array of micromirror light modulators can be singulated, tested, and packaged (block 420).

A sequence of events shown in FIG. 4b illustrates a detailed view of the create mirrors event 415 of the sequence of events 400 (FIG. 4a). The creation of the mirrors can begin with the forming of a resist layer over the previously created hinges (block 455). The resist layer can be formed on the semiconductor substrate by a technique such as spin coating. After the semiconductor substrate is covered by the layer of resist and the resist layer is soft baked, such as with a hot plate, the resist layer is then patterned (block 460). As discussed previously, the resist layer can be patterned by a light (or by some form of radiation) that is passed through a mask that contains either a negative or a positive of the pattern to be produced on the resist layer. The light (or radiation) changes the properties of the resist layer, either making the resist layer susceptible or insusceptible to a solution that is used to develop the resist (block 465). The developing solution can either remove the portions of the resist layer that were patterned by the light (radiation) or the portions of the resist layer that were not patterned, depending upon the nature of the resist material and the developing solution.

After the resist layer has been developed (block 465), the resist layer can be cured to stabilize the resist layer (block 470). For example, if the resist layer is created from an I-line resist or a deep UV (DUV) resist, then UV light in conjunction with a heat source, such as a hot plate, can be used to cure the resist layer. The use of the UV light and the heat source results in the cross-linking of the polymers in the resist layer. Once cured, the resist layer can once again be developed, preferably utilizing the same developing solution as the develop resist process (block 465) to remove contaminants (block 475). The repeated use of the resist develop can simplify the manufacture of the array of micromirror light modulators since there are no new processes to be added to the manufacture, which can result in minimized impact on the production costs and the manufacturing complexity of the array of micromirror light modulators. With the contaminants removed, the mirror surface can then be deposited, such as by sputter deposition, on the patterned resist layer (block 480).

Although the discussion above presents the use of the present invention to clean contaminants from a resist develop as it pertains to the creation of the mirror of a micromirror light modulator, the present invention can be applied to other manufacturing processes wherein a resist develop is used in the patterning of a resist layer and wherein a subsequent manufacturing process involves the creation of a layer using the patterned resist layer wherein the presence of the contaminants can have a negative effect on function and/or reliability of the layer. For example, in the sequence of events 400 describing the manufacture of an array of micromirror light modulators shown in FIG. 4a, the present invention can be used to clean contaminants in the create hinges manufacturing process (block 410) or the electrical addressing circuitry manufacturing process (block 405).

Figure 5:
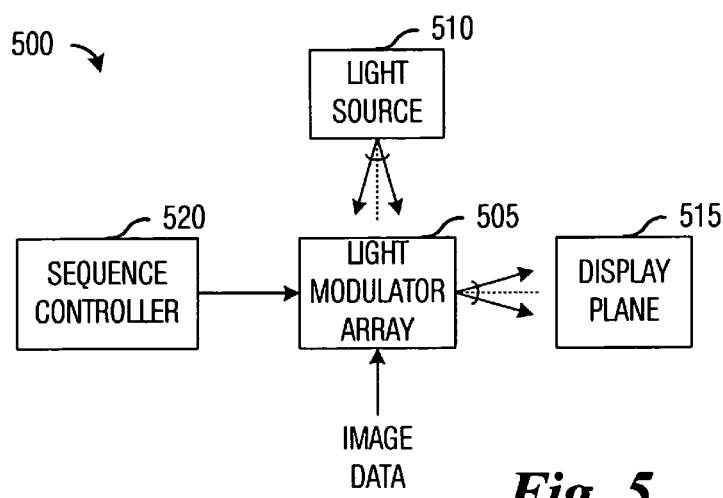
FIG. 5 is a diagram of a display system, according to a preferred embodiment of the present invention.

With reference now to FIG. 5, there is shown a diagram illustrating an exemplary display system 500, wherein the display system 500 utilizes an array of micromirror light modulators 505 (also referred to as a DMD), according to a preferred embodiment of the present invention. The individual light modulators in the DMD 505 assumes a state that corresponds to image data for an image being displayed by the display system 500, wherein, depending upon the image data, an individual light modulator can either reflect light from a light source 510 away from or towards a display plane 515. A combination of the reflected light from all of the light modulators in the DMD 505 produces an image corresponding to the image data. A sequence controller 520 coordinates the loading of the image data into the DMD 505, controlling the light source 510, and so forth.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating an array of light modulators on a substrate, the method comprising:
    forming electrical addressing circuitry on the substrate;
    forming hinges over the electrical addressing circuitry;
    forming mirrors on each hinge, wherein forming the mirrors comprises:
        developing a resist layer formed over the hinges;
        curing the developed resist layer;
        cleaning the cured developed resist layer with a developer solution to remove contaminants; and
        depositing a mirror material over the cured developed resist layer.

2. The method of claim 1, wherein the forming of electrical addressing circuitry comprises:
    developing a resist layer formed over the substrate;
    etching a material of the circuitry; and
    cleaning the resist layer with an ash and a developer solution.

3. The method of claim 1, wherein the forming of hinges comprises developing a second resist layer formed over the electrical addressing circuitry, and wherein the method further comprises:
    curing the developed second resist layer;
    cleaning the cured developed second resist layer with the developer solution to remove contaminants; and
    depositing a hinge material on the cured and cleaned second resist.

4. The method of claim 1, wherein the curing comprises an ultraviolet cure.

5. The method of claim 1, wherein the developing comprises:
    patterning the resist layer; and
    applying the developer solution to remove portions of the patterned resist layer.

6. The method of claim 1, wherein the mirror material is selected from a group comprising: aluminum, titanium, and silicon.

7. The method of claim 1 further comprises after the depositing, etching away the cured developed resist layer.

8. The method of claim 7, wherein the etching is an isotropic etch.

9. The method of claim 1, wherein the curing comprises an ultraviolet cure.

10. A method for forming a display system, the method comprising:
    optically coupling an array of light modulators to a light source, wherein the array of light modulators creates images by setting each light modulator in the array to a state needed to properly display an image on a display plane by reflecting a light from the light source, wherein the array of light modulators is manufactured by
        forming electrical addressing circuitry on the substrate;
        forming hinges over the electrical addressing circuitry;
        forming mirrors on each hinge, wherein the mirror forming comprises
            developing a resist layer formed over the hinges;
            curing the developed resist layer;

cleaning the cured developed resist layer with a developer solution to remove contaminants;

depositing a mirror material over the developed resist layer; and coupling a controller to the array of light modulators, the controller issuing commands to control the operation of the array light modulators.

11. The method of claim 10, wherein the array of light modulators is a digital micromirror device (DMD).

12. The method of claim 10, wherein the array of light modulators is an array of deformable mirrors.

* * * * *

UNITED STATES PATENT AND TRADEMARK OFFICE
CERTIFICATE OF CORRECTION

PATENT NO.       : 7,622,244 B2                                                Page 1 of 1
APPLICATION NO. : 11/407634
DATED            : November 24, 2009
INVENTOR(S)      : McFadden et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 849 days.

Signed and Sealed this

Twenty-sixth Day of October, 2010

David J. Kappos
*Director of the United States Patent and Trademark Office*